United States Patent [19]

Beyer et al.

[11] 4,355,289

[45] Oct. 19, 1982

[54] PHASE SHIFT AND AMPLITUDE MODULATOR

[75] Inventors: James B. Beyer, Madison, Wis.; James B. Summers, Spokane, Wash.

[73] Assignee: Wisconsin Alumni Research Foundation, Madison, Wis.

[21] Appl. No.: 168,502

[22] Filed: Jul. 14, 1980

[51] Int. Cl.[3] .................. H03C 5/00; H04L 27/20
[52] U.S. Cl. ............................. 332/17; 332/23 R; 332/48; 332/52; 375/42
[58] Field of Search ............... 332/16 R, 17, 23 R, 332/29 R, 31 R, 48, 52; 375/42, 55, 67; 455/108

[56] References Cited

U.S. PATENT DOCUMENTS

| | | | |
|---|---|---|---|
| 3,624,559 | 11/1971 | Schaeperkoetter | 332/31 R X |
| 3,701,053 | 10/1972 | de Rubinat | |
| 3,798,573 | 3/1974 | Seidel | |
| 3,996,532 | 12/1976 | Fletcher et al. | |
| 4,021,758 | 5/1977 | Standing | |
| 4,028,641 | 6/1977 | Bodtmann et al. | |
| 4,090,147 | 5/1978 | Seidel | |
| 4,276,521 | 6/1981 | Davidheiser | 332/23 R |

FOREIGN PATENT DOCUMENTS 52-8763  1/1977  Japan .................................. 332/17

*Primary Examiner*—Siegfried H. Grimm
*Assistant Examiner*—Edward P. Westin
*Attorney, Agent, or Firm*—Isaksen, Lathrop, Esch, Hart & Clark

[57] ABSTRACT

A parallel type modulator is disclosed which utilizes a pair of bi-phase modulators (10), each of which are capable of independent phase and amplitude modulation. In each bi-phase modulator, a carrier frequency signal is split by a power splitter (20) into two signals 180° apart in phase which are passed through directional couplers (30 and 31) and a pair of PIN diodes (35 and 36) to a summing junction (37). A bias source circuit (42) delivers biasing current to the coupled outputs of the directional couplers (30, 31) and through the PIN diodes (35, 36) to the summing junction (37); this current is returned to ground through a bias return circuit (44) which conducts the DC or low frequency biasing signal but allows the carrier frequency output signal to be passed through to the output of each bi-phase modulator. Reduction of the bias current to one diode below null levels at which the intermediate signals cancel will cause a carrier frequency signal to appear at the summing junction which will be in phase with the signal passed through the other diode. A continuous variation of the bias current through one of the diodes at a level below the null current level will result in amplitude modulation of the output signal at the summing junction. The PIN diodes are always operated in their conducting regions so that large parasitic reactances at microwave frequencies are avoided. A parallel modulator can be formed of a pair of the bi-phase modulators provided with carrier frequency signals in quadrature, and with the outputs of each bi-phase modulator being summed to yield an output signal at the carrier frequency which can have an arbitrary phase angle and continuous modulation of amplitude.

21 Claims, 5 Drawing Figures

4,355,289

PHASE SHIFT AND AMPLITUDE MODULATOR

TECHNICAL FIELD

This invention pertains to the field of amplitude and phase modulators, and particularly to digital phase shift keying modulators at microwave frequencies.

BACKGROUND ART

Digital phase modulation, or phase shift keying (PSK), has found significant use in terrestrial and satellite communication systems, particularly at microwave frequencies. Digital phase modulation has the advantage that, for a given carrier to noise ratio, the bit error rate of a digital phase modulated system is smaller than that of pulse amplitude modulation or frequency shift keying systems. Common forms of phase shift keying systems use 2, 4, 8 or 16 phase states; e.g., a bi-phase system would have phase states at 0° and 180°, a quadrature system would have four phase states each separated by 90°, and so forth. Modulators capable of generating such phase shift states may generally be grouped into series, parallel, and commutating categories, depending upon the manner in which the phase shift is developed. The present invention may be considered to fall within the class of parallel modulators.

In a parallel modulator, the outputs of two amplitude controllable bi-phase modulators may be combined in quadrature to form the basis for the output signal; by control of the amplitude and phase—either 0° or 180°—of each of the bi-phase modulators, an output signal having an arbitrary phase angle can be produced. It is possible for a parallel modulator to be structured to provide amplitude modulation as well as phase shift keying, and to allow continuous phase modulation.

At microwave frequencies, the construction of workable modulators becomes difficult because of the phase errors introduced by parasitic reactances; as a result of these reactances, the amplitude signal is difficult to control without substantially varying the phase from the desired 0° or 180°. Because attenuation is obtained in typical diode ring mixers by turning the diodes off, the diode junction by itself presents a particularly significant capacitive reactance at microwave frequencies.

DISCLOSURE OF THE INVENTION

In accordance with the present invention, a parallel modulator capable of independent phase and amplitude control is formed using novel bi-phase modulators.

Each bi-phase modulator of the invention utilizes diodes which are always turned on so as to minimize the parasitic reactances associated with the diodes, and is well adapted to be economically constructed using microstrip techniques.

Each bi-phase modulator includes a power splitter which splits the continuous wave carrier input signal into two intermediate signals which are equal in amplitude and 180° out of phase. At microwave frequency operation, each of the two intermediate signals are coupled through directional couplers to a pair of PIN diodes which are connected together at a common summing junction. The directional couplers allow a lower frequency biasing signal to be provided to the diodes; additionally, the coupler terminations absorb most of the power which is reflected back from the diodes. The diode bias signals are returned through the summing junction to ground via a bias return filter—e.g., a quarter wavelength shorted stub.

With proper adjustment of the DC bias level, both diodes will be operated fully on, and the two microwave frequency intermediate signals conducted through the diodes will exactly cancel at the summing junction—a null condition. If the bias current provided to the diode which is conducting the intermediate signal at 0° phase angle is reduced from the null condition current, the intermediate signal at 180° will not be completely cancelled at the junction, and thus the phase of the output signal will be at 180°. The output amplitude may thereafter be continuously controlled by varying the bias current of the diode conducting the 0° intermediate signal; for example, a low frequency signal may be superimposed on the bias current flowing through the diode conducting the 0° intermediate signal, thereby allowing continuous amplitude modulation of the carrier frequency output. Conversely, when the DC bias level current through the diode conducting the 180° phase intermediate signal is reduced from the null current level, the phase of the output signal will be at 0°; and the amplitude of the output signal may be controlled by varying the bias current through the diode conducting the 180° signal.

Two bi-phase modulators of the type described above may be combined in a parallel modulator configuration to yield a modulated output signal which, with proper control of the bias inputs to the bi-phase modulators, can be controlled to an arbitrary phase angle between 0° and 360°, and to a continuously controllable amplitude.

Further objects, features, and advantages of the invention will be apparent from the following detailed description taken in conjunction with the accompanying drawings.

BEST MODE FOR CARRYING OUT THE INVENTION

Figure 1:
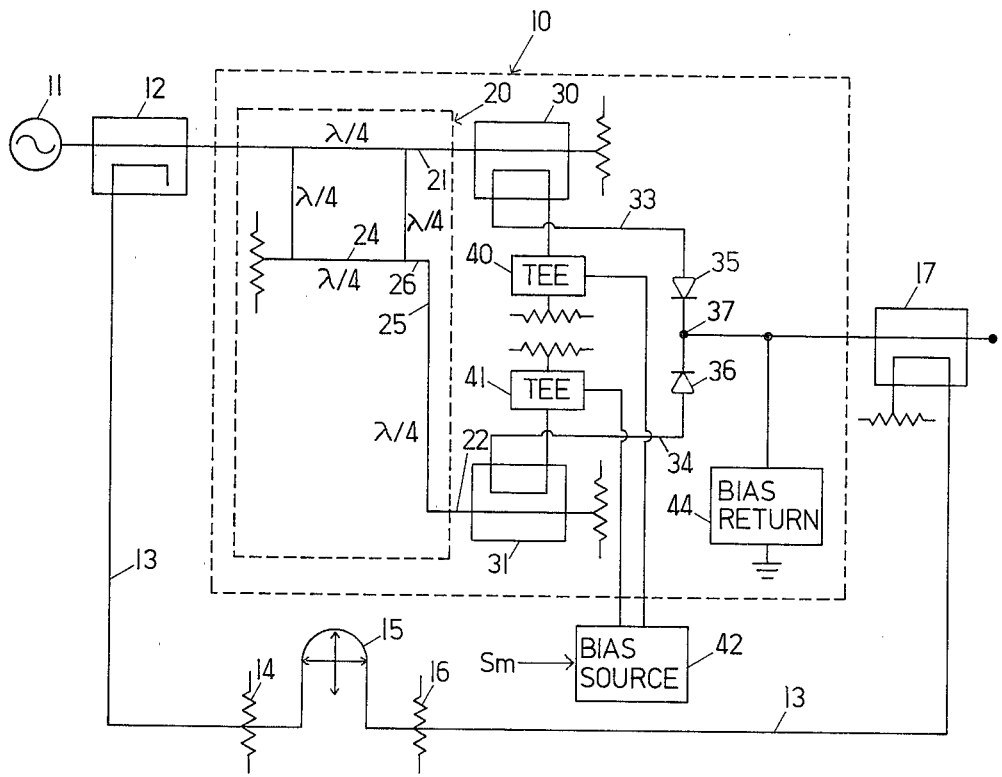
FIG. 1 is a schematic view of a bi-phase modulator in accordance with the invention.

With reference to the drawings, a schematic view of a bi-phase modulator in accordance with the invention which is adapted for microwave frequency operation is shown generally within the dashed lines labeled 10 in FIG. 1. The modulator 10 is driven by a microwave signal source 11 which produces a continuous wave carrier signal at the desired carrier frequency; e.g., 3.0 GHz. For reasons that will be described later, the output signal from the signal source 11 is provided to a first directional coupler 12 which transmits a reference signal at a 90° phase lag on a transmission line 13 through a 10 dB step variable attenuator 14, a line stretcher 15, and a 1 dB step variable attenuator 16 to a summing coupler 17, which sums the signal with the output of the bi-phase modulator 10.

The carrier frequency signal transmitted through the coupler 12 to the modulator 10 is first passed through a 180° power splitter 20 which provides a first intermediate signal on a line 21 at a reference phase angle of 0°, and a second intermediate signal on a line 22 at a phase angle which lags the signal on the first line 21 by 180°. The 180° power splitter 20 illustrated in FIG. 1 comprises a branch line hybrid 24 having an extra quarter wavelength of transmission line 25 connected to the 90° lagging output port 26 of the hybrid. The quarter wavelength delays in the hybrid and transmission delay line are noted by the $\lambda/4$ notations marked on FIG. 1 next to the pertinent portions of the hybrid and the delay line.

The intermediate signals on the lines 21 and 22 are passed to a pair of directional couplers 30 and 31, respectively, which preferably have a coupling coefficient between 3 and 10 dB. The lower limit of the coupling coefficient is dictated by the practical mechanization of the couplers using microstrip techniques, and the upper limit is set by the amount of modulator insertion loss which may be tolerated.

The coupled outputs of the couplers 30 and 31 are passed on output lines 33 and 34, respectively, to PIN diodes 35 and 36. The outputs of the PIN diodes are connected directly together at a summing junction 37, and the output signal at this junction is passed through to the output coupler 17. The PIN diodes are preferably low capacitance beam leaded diodes having a fast reverse recovery time. Low diode capacitance is desired, since the minimum insertion loss of the modulator depends upon the phase error introduced by the diode capacitance; the greater the diode capacitance, the greater the phase error at high output amplitudes, and the smaller the usable dynamic range. A beam leaded diode is preferred in order to avoid, as much as possible, the packaging parasitic reactances which would also tend to diminish the usable dynamic range of the modulator.

The directional couplers 30 and 31 allow a DC and/or lower frequency biasing signal to be superimposed upon the carrier frequency intermediate signals. The direct ports of the directional couplers are terminated, and the isolated ports of the coupler 30 and 31 are connected through terminated bias Tees 40 and 41 to a bias source circuit 42. The bias source circuit 42 converts an input signal $S_m$ to appropriate bias currents which are provided through the Tees 40 and 41 and the directional couplers to the PIN diodes. Generally, a DC current bias level is selected such that the diodes will be operating on a substantially linear portion of their voltage-current characteristic; and such that the carrier frequency intermediate signals passing through the diodes 35 and 36 will substantially cancel at the summing junction 37 when no input signal is provided to the bias source circuit 42. This circuit may be constructed to respond to a digital input signal $S_m$ to shift the output phase at the summing junction 37 from 0° to 180° depending on the level of the signal $S_m$. As a further example, the bias source circuit may be constructed such that the output phase is at 0° or 180°, depending on the polarity of the input signal $S_m$, and the amplitude of the output signal is modulated in accordance with the continuous variation of either the positive or negative amplitude of the modulating signal $S_m$. The DC bias current, and any low frequency variation thereof which follows the input signal $S_m$, are returned from the summing junction 37 to ground through a bias return filter 44, which passes the high frequency modulated carrier from the junction 37 to the output coupler 17 without substantial attenuation.

For ideal and perfectly matched components, with both PIN diodes biased at the same current level, the output of the modulator 10 should be 0. However, this will not be the case if the bias source circuit 42 does not provide a match to the hybrid couplers 30 and 31 at the carrier frequency; in which event, a quadrature phase signal component will be present at the PIN diodes. The output under null conditions will be offset from zero due to this quadrature component. This mismatch also results in the real parts of the reflection coefficients at the two diodes being unequal; while this portion of the mismatch can be corrected by varying the DC current bias level of one diode, the quadrature term cannot be cancelled in this manner.

Figure 2:
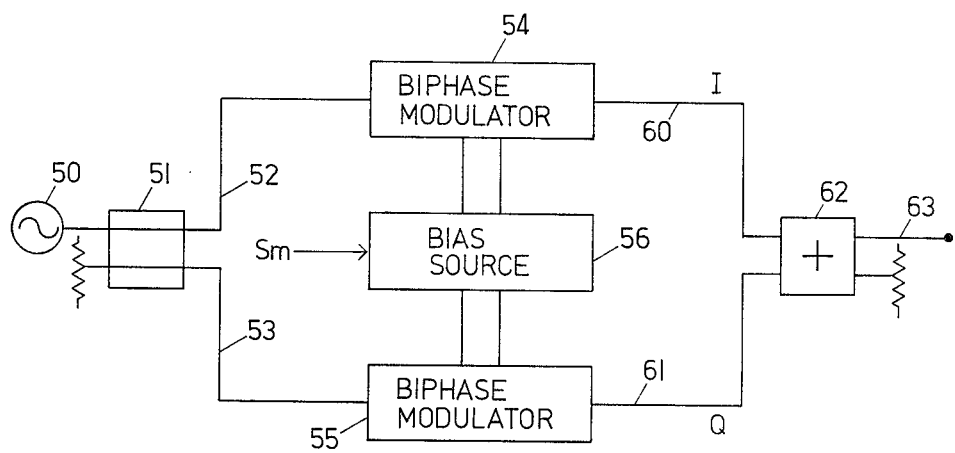
FIG. 2 is a schematic view of a pair of bi-phase modulators combined to provide a parallel modulator in accordance with the invention having continuous phase and amplitude control.

In a quadrature PSK parallel modulator, such as that shown in FIG. 2, a consistent amplitude quadrature offset in one channel of the modulator can be nulled by adding a portion of the signal from the other quadrature channel which is equal in amplitude and 180° out of phase with the offset. However, if the bi-phase modulator 10 is used by itself, the quadrature cancelling signal can be provided by summing in the signal provided on the line 13 through the step attenuators 14 and 16 and the line stretcher 15. These components can be adjusted so as to allow the signal summed with the modulator output signal in the output coupler 17 to bear the desired phase relationship with the quadrature signal, i.e., 180° out of phase, and to have a magnitude adjusted so as to exactly cancel the unwanted quadrature component.

Figure 3:
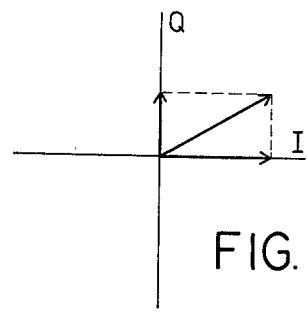
FIG. 3 is a graph illustrating the combination of the bi-phase modulators' signals in quadrature to form a modulated output signal having an arbitrary amplitude and phase.

The incorporation of two bi-phase modulators into a parallel modulator configuration having continuous amplitude and phase control is shown in FIG. 2. A carrier frequency signal from a source 50 is passed through a 90° power splitter 51, such as a branch hybrid, to produce a 0° phase reference signal on a first carrier line 52 and a 90° lagging phase signal on a second carrier line 53. The signals on these lines are then provided as carrier frequency inputs to a pair of bi-phase modulators 54 and 55, respectively, which are each identical to the bi-phase modulator shown within the dashed lines labeled 10 in FIG. 1. Each of these modulators is driven by a bias source 56 which receives a modulating signal $S_m$ and processes it to provide the appropriate drive signals to the modulators 54 and 55. The outputs from the two bi-phase modulators, on lines 60 (having an output signal labeled "I") and 61 (having an output signal labeled "Q") are provided to a summing coupler 62 having an output port 63. While the output signals I and Q will always be in quadrature with one another, the phase of each signal may vary by 180°, and the amplitude of each is arbitrarily controllable. Thus—as the phasor representation of the output on the line 63 shown in FIG. 3 illustrates—, the phasor sum of the two signals can be of any chosen amplitude or phase angle, depending on the relative amplitudes and phase angles of the signals Q and I. In this manner, the output signal may be modulated continuously in both phase and amplitude.

Figure 4:
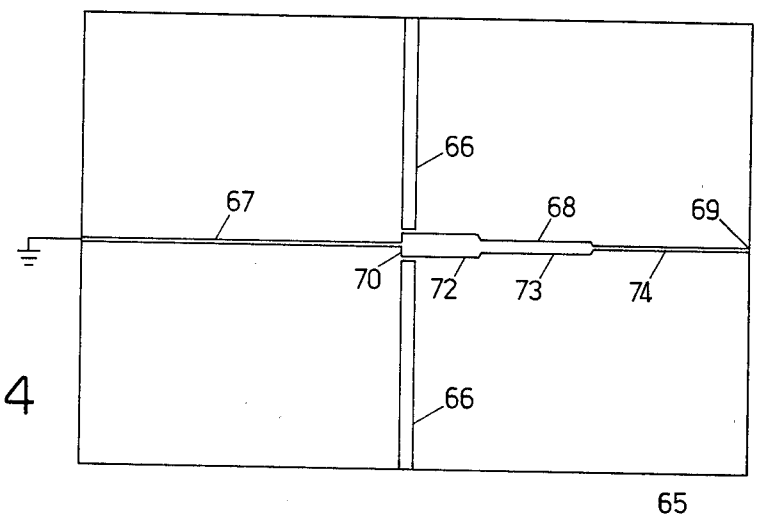
FIG. 4 is a plan view of a microstrip substrate on which the summing junction portion of the bi-phase modulator is formed.

A plan view of a microstrip substrate suitable for mounting of the two PIN diodes 35 and 36 is shown at 65 in FIG. 4. The microstrip substrate is of standard design and is composed of 25 mil thick alumina, with the various conductive strips being formed on the surface of the substrate by gold metalization. The conductive strips include two input leads 66 which may be connected to coaxial cables leading from the directional couplers 30 and 31, a bias return path shorted stub 67, and an impedance transforming strip 68 from which the summed output is taken at the output end 69 of the strip. The summing junction is formed at the intersection 70 of the strips 67 and 68; and the PIN diodes (not shown in FIG. 4) are connected between the inner ends of the lead-in strips 66 and the intersection 70.

The shorted stub 67 provides a very simple bias return path which presents a very high impedance to the carrier frequency microwave signal at the summing junction, yet returns to ground the lower frequency bias current. The shorted stub 67 performs satisfactorily as long as the side bands of the modulated carrier signal do not contain frequencies which substantially deviate from the carrier frequency. As an alternative, a multipole band-pass or low pass filter of design apparent to those skilled in the art can be connected between the intersection 70 and ground to provide a return for the low frequency and DC bias currents, while allowing the modulated carrier to be passed to the impedance transforming strip 68.

The impedance transformer 68 consists of three quarter-wavelength sections 72, 73, and 74. The purpose of the impedance matching strip is to reduce the variation in the output voltage standing wave ratio (VSWR). When both diodes are biased on, the carrier frequency impedance from the summing junction to ground will be approximately one-half the impedance seen when one diode is biased off; thus, the output VSWR may vary between 1 and 2. The impedance matching network lowers the summing node impedance and minimizes this variation. A single quarter-wavelength impedance transforming section might be utilized, but it is noted that the bandwidth of the match is fairly critical because the transformer strip is transmitting the modulated carrier signal. A multisection quarter wavelength transformer, such as the three section strip 68 shown in FIG. 4, is capable of providing an impedance match over a wider bandwidth.

Figure 5:
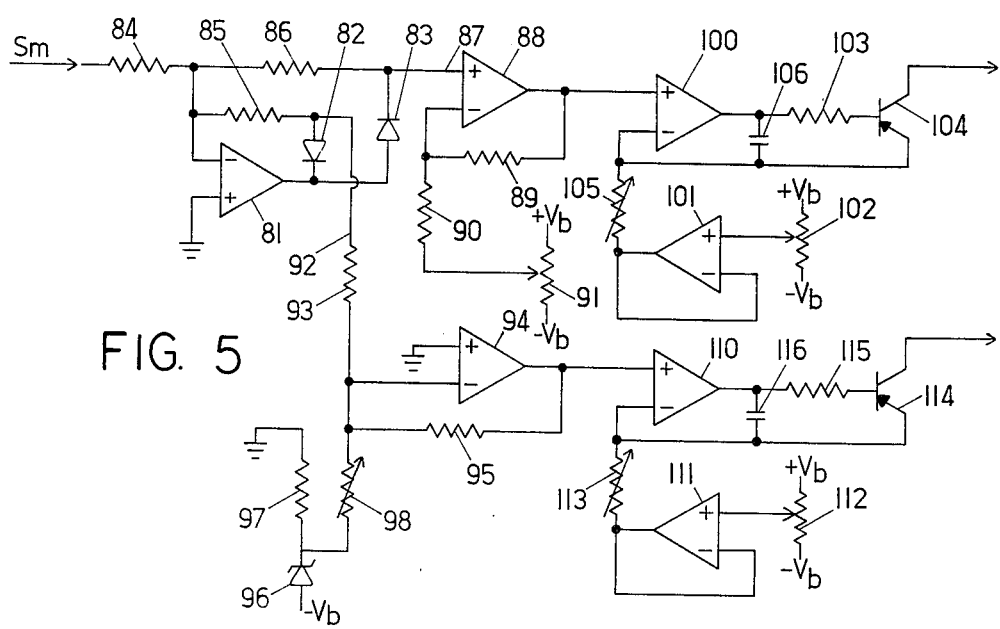
FIG. 5 is a schematic circuit diagram of a biasing circuit for the modulator of FIG. 1.

An exemplary low frequency bias current generator suitable for use as the bias source 42 is shown in FIG. 5. The modulating signal, $S_m$, is provided to a precision rectifier composed of an operational amplifier 81, diodes 82 and 83 connected with opposite polarity to the output of the amplifier 81, and associated resistors 84, 85 and 86. The positive following rectified output on a line 87 is passed through a buffer operational amplifier 88 having a feedback resistor 89 connected between its output and its negative input. An offset voltage is provided to the negative amplifier input through a resistor 90 and a potentiometer 91 connected between positive and negative voltage sources. The negative following rectifier output on a line 92 is provided through an input resistor 93 to an inverting amplifier 94 having a feedback resistor 95. A regulated offset input is provided from a zener diode 96, connected between a negative voltage source and a resistor 97 to ground, through a variable resistor 98 to the inverting input of the operational amplifier 94. The output voltages of the operational amplifiers 88 and 94 may be adjusted by means of the adjustable resistors 91 and 98 to provide an appropriate offset.

The output of the amplifier 88 is provided to an operational amplifier 100 which forms a portion of a voltage to current converter. A null level current is provided from the output of an operational amplifier 101 which has an adjustable voltage input provided through a potentiometer 102 connected between positive and negative voltage sources. The output of the operational amplifier 100 is directed through an input resistor 103 to the base of a transistor 104 which has the emitter thereof connected to receive the null level current from the output of the amplifier 101 through a variable resistor 105. A small compensation capacitor 106 is connected as shown between the emitter of the transistor 104 and the output of the amplifier 100, and the output current from the collector of the transistor is provided to the first PIN diode 35 through the coupler 30.

The output of the inverting amplifier 94 is provided to an operational amplifier 110 which forms part of a second voltage to current converter. This converter also includes a second operational amplifier 111 provided with an input signal from the wiper of a potentiometer 112 connected between positive and negative voltage sources, with the output of the amplifier 111 being provided through a variable resistor 113 to the negative input of the operational amplifier 110 and to the emitter of a transistor 114. The output of the operational amplifier 110 is transmitted to the base of the transistor 114 through a resistor 115, and a compensation capacitor 116 is connected between the output of the operational amplifier 110 and the emitter of the transistor. The collector current from the transistor 114 is provided to the second PIN diode 36 through the coupler 31.

The foregoing bias source circuit is illustrative of circuits readily apparent to those skilled in the art which can be used to drive and bias the PIN diodes to the desired operating condition.

It is understood that the invention is not confined to the particular construction and arrangement of parts herein illustrated and described, but embraces all such modified forms thereof as come within the scope of the following claims.

We claim:

1. A bi-phase modulator having independent phase shift and amplitude control, comprising:
   (a) means for splitting a carrier frequency signal into two intermediate signals which are substantially equal in amplitude and 180° out of phase with each other;
   (b) a pair of directional couplers each receiving one of the intermediate signals, each directional coupler providing an isolated output which is proportional to the amplitude of the signal received by the coupler;
   (c) a pair of diodes each connected to receive the isolated output signal from one of the directional couplers, the outputs of the diodes being connected together at a summing junction;
   (d) biasing circuit means for providing a current to each of the directional couplers which is added to the isolated output signal from each coupler to allow the diodes to be biased to a null condition level at which the carrier frequency signals passed through the diodes substantially cancel each other at the summing junction; and
   (e) bias return circuit means connected to the summing junction for providing a return for the bias current from the biasing circuit means while passing a signal at the junction which is substantially at the frequency of the carrier signal, whereby the output signal at the summing junction will be substantially zero at the null condition and whereby the output at the summing junction will be a carrier frequency signal at either a 0° reference phase or a 180° lagging phase if the bias current to one or the other of the diodes is reduced below the null condition current.

2. The modulator of claim 1 wherein the diodes connected to receive the isolated output signal from the directional couplers are PIN diodes, whereby the modulator is particularly adapted to operate at microwave frequencies.

3. The modulator of claim 1 or 2 wherein the biasing circuit means includes means for providing a modulating signal, at a frequency substantially lower than the carrier frequency signal, which is added to the isolated output of one of the directional couplers, and wherein the bias return circuit means also provides a return for the modulating signal while passing the modulated carrier signal.

4. The modulator of claim 1 or 2 wherein the means for splitting a continuous carrier signal comprises a branch line hybrid having two outputs differing in phase by approximately 90° and an additional quarter wavelength delay line connected to the lagging output of the branch hybrid to provide an output signal which lags the other output of the branch hybrid by 180°.

5. The modulator of claim 3 wherein the bias return circuit means comprises a shorted stub connected from the summing junction to ground having a length which is one quarter of the wavelength of the chosen carrier frequency.

6. The modulator of claim 5 including an impedance transforming output section connected from the summing junction to an output.

7. The modulator of claim 6 wherein the shorted stub, impedance transforming section, and diodes are mounted on an alumina microstrip substrate, and wherein the impedance transforming section comprises multiple sections of quarter wavelength strips extending from the summing junction to the output which are selected to provide an impedance match over a wide bandwidth.

8. The modulator of claim 1 or 2 including a microwave carrier signal generator connected to provide a carrier frequency signal to the means for splitting a carrier frequency signal.

9. The modulator of claim 1 or 2 including a first directional coupler which splits off a quadrature signal at 90° phase lag from the carrier frequency signal which is provided to the means for splitting, an adjustable attenuator connected to receive the 90° signal from the first coupler for attenuating the same in adjustable steps, adjustable delay means connected to the adjustable attenuator for selectively changing the phase delay of the signal passed therethrough, and an output coupler connected to receive the adjustably attenuated and delayed quadrature signal and to couple it with the output signal from the summing junction, whereby the adjustable attenuator and adjustable delay means may be adjusted to provide a signal to the output coupler which substantially cancels any quadrature component contained in the carrier frequency output signal from the summing junction.

10. The modulator of claim 3 wherein the biasing source circuit means comprises a rectifier means for receiving a lower frequency modulating input signal and providing two output signals, one proportional to the positive voltage portion of the modulating input signal and the other proportional to the negative voltage portion of the modulating input signal, a first voltage to current converter connected to receive the positive voltage output from the rectifier means which provides an output current proportional thereto which is directed to a first of the pair of directional couplers, and a second voltage to current converter connected to receive the negative voltage output from the rectifying means which provides an output current proportional thereto which is directed to a second of the pair of directional couplers, the first and second voltage to current converters being adjustable to provide currents under null conditions to the directional couplers and diodes such that the carrier frequency output at the summing junction can be substantially zero when a zero level modulating input signal is provided to the rectifier means.

11. A microwave amplitude and phase modulator, comprising:
(a) means for splitting a carrier frequency input signal into two output signals substantially equal in amplitude and 90° apart in phase;
(b) a pair of bi-phase modulators having independent phase shift and amplitude control, each connected to receive one of the outputs of the means for splitting a carrier frequency signal, each bi-phase modulator comprising:
 (1) means for splitting the received carrier frequency output signal into two intermediate signals which are substantially equal in amplitude and 180° out of phase with each other;
 (2) a pair of directional couplers each receiving one of the intermediate signals, each directional coupler providing an isolated output which is proportional to the amplitude of the signal received by the coupler;
 (3) a pair of diodes each connected to receive the isolated output signal from one of the directional couplers, the outputs of the diodes being connected together at a summing junction;
 (4) bias return circuit means connected to the summing junction for providing a return for a bias current while passing a signal at the junction which is substantially at the frequency of the carrier signal;
(c) biasing circuit means for providing a current to each of the directional couplers of both bi-phase modulators which is added to the isolated output signal from each coupler to allow the diodes to be biased to a null condition level at which the carrier frequency signals passed through the diodes substantially cancel each other at the summing junctions; and
(d) means for summing the output signals at the summing junctions of the bi-phase modulators to produce a modulated output signal which is capable of being continuously amplitude and phase modulated by control of the bias currents provided by the biasing circuit means.

12. The modulator of claim 11 wherein the diodes connected to receive the isolated output signals from the directional couplers are PIN diodes, whereby the modulator is particularly adapted to operate at microwave frequencies.

13. The modulator of claim 11 or 12 wherein the biasing circuit means includes means for providing a modulating signal, at a frequency substantially lower than the carrier frequency signal, which is added to the isolated output of at least one of the bi-phase modulator directional couplers, and wherein the bias return circuit means also provides a return for the modulating signal while passing the modulated carrier signal.

14. The modulator of claim 11 or 12 wherein the means for splitting a continuous carrier signal in each bi-phase modulator comprises a branch line hybrid having two outputs differing in phase by approximately 90° and an additional quarter wavelength delay line connected to the lagging output of the branch hybrid to provide an output signal which lags the other output of the branch hybrid by 180°.

15. The modulator of claim 13 wherein the bias return circuit means comprises a shorted stub connected from the summing junction to ground having a length which is one quarter of the wavelength of the chosen carrier frequency.

16. The modulator of claim 15 including an impedance transforming output section connected from the summing junction of each bi-phase modulator to its output.

17. The modulator of claim 16 wherein the shorted stub, impedance transforming section, and diodes of each bi-phase modulator are mounted on an alumina microstrip substrate, and wherein the impedance transforming section comprises multiple sections of quarter wavelength strips extending from the summing junction to the output of each bi-phase modulator which are selected to provide an impedance match over a wide bandwidth.

18. The modulator of claim 11 or 12 including a microwave carrier signal generator connected to provide a carrier frequency signal to the means for splitting a carrier frequency input signal into two signals 90° apart in phase.

19. The modulator of claim 11 or 12 wherein the means for splitting a carrier frequency signal into two signals 90° apart in phase comprises a branch hybrid.

20. A method of modulating a microwave carrier frequency signal, comprising the steps of:
  (a) splitting a carrier frequency signal into two intermediate signals which are 180° out of phase with one another;
  (b) passing each intermediate signal through a diode to a summing junction;
  (c) passing a null bias current through each diode at a level selected to cause the intermediate signals passing through each diode to cancel one another at the summing junction at a null condition; and
  (d) superimposing a varying bias current on the null bias current provided to one of the diodes, whereby the output signal at the summing junction may be varied by 180° in phase depending on whether the varying bias current is positive or negative, and whereby the carrier frequency output signal may be amplitude modulated in proportion to the varying bias current.

21. The method of claim 20 wherein the diodes through which the intermediate signal and bias currents are passed are PIN diodes.

* * * * *